United States Patent
Zambrano

(10) Patent No.: US 7,050,322 B2
(45) Date of Patent: May 23, 2006

(54) DEVICE INTEGRATING A NONVOLATILE MEMORY ARRAY AND A VOLATILE MEMORY ARRAY

(75) Inventor: Raffaele Zambrano, Viagrande (IT)

(73) Assignee: STMicroelectronics, S.r.l. (IT)

( * ) Notice: Subject to any disclaimer, the term of this patent is extended or adjusted under 35 U.S.C. 154(b) by 93 days.

(21) Appl. No.: 10/360,840

(22) Filed: Feb. 7, 2003

(65) Prior Publication Data

US 2003/0174531 A1 Sep. 18, 2003

(30) Foreign Application Priority Data

Feb. 8, 2002 (IT) ............................ TO2002A0118

(51) Int. Cl.
*G11C 11/22* (2006.01)
(52) U.S. Cl. ....................................................... 365/145
(58) Field of Classification Search ................ 365/149, 365/145, 117, 65, 189.04, 102
See application file for complete search history.

(56) References Cited

U.S. PATENT DOCUMENTS

| | | | | |
|---|---|---|---|---|
| 5,303,186 A | * | 4/1994 | Yamauchi | ............... 365/185.08 |
| 5,539,279 A | * | 7/1996 | Takeuchi et al. | ............. 365/145 |
| 5,675,547 A | * | 10/1997 | Koga | ..................... 365/230.03 |
| 5,768,182 A | * | 6/1998 | Hu et al. | ..................... 365/145 |
| 6,141,238 A | * | 10/2000 | Forbes et al. | ............... 365/145 |
| 6,337,805 B1 | * | 1/2002 | Forbes et al. | ............... 365/145 |
| 6,440,754 B1 | * | 8/2002 | Hayashi et al. | ............. 257/296 |
| 6,441,415 B1 | * | 8/2002 | Moise et al. | ................ 365/145 |

* cited by examiner

*Primary Examiner*—Thong Q. Le
(74) *Attorney, Agent, or Firm*—Lisa K. Jorgenson; Graybeal Jackson Haley LLP

(57) ABSTRACT

An integrated device including a first memory array having first memory cells of a nonvolatile type and a second memory array having second memory cells of a volatile type (DRAM). The first memory cells and the second memory cells are formed in a substrate of semiconductor material, and each includes a respective MOS transistor which is formed in an active region of the substrate and has a first conductive region and a respective capacitor which is formed on top of the active region and has a first electrode and a second electrode, which are separated by a dielectric region. Moreover, the first electrode of the capacitor is connected to the first conductive region of the MOS transistor. The first and the second memory cells have a structure that is substantially the same and are formed simultaneously.

10 Claims, 5 Drawing Sheets

US 7,050,322 B2

DEVICE INTEGRATING A NONVOLATILE MEMORY ARRAY AND A VOLATILE MEMORY ARRAY

PRIORITY

This application claims the priority of Italian Patent Application No. TO2002A 000118 entitled A DEVICE INTEGRATING A NONVOLATILE MEMORY ARRAY AND A VOLATILE MEMORY ARRAY, filed Feb. 8, 2002, which is hereby incorporated by reference.

FIELD OF THE INVENTION

The present invention relates to a device integrating a nonvolatile memory array and a volatile memory array.

BACKGROUND OF THE INVENTION

As is known, in various sectors of microelectronics there is an ever increasing need to integrate, in a single chip, various devices, which are specifically designed and optimized for a particular application, so as to obtain efficient and extremely compact dedicated systems (System-on-Chip). By way of example, it may be recalled that in important fields of use, such as that of mobile telephones, microprocessor cards (smart cards), image-acquisition devices (digital videocameras and cameras), palm-top computers, in which fundamental objectives are the reduction of overall dimensions, the reduction of supply voltages, and the reduction of consumption in general.

To achieve this purpose, it is particularly important to succeed in integrating logic devices for processing and control, generally referred to as digital-signal processors (DSPs), and memory devices (the so-called "embedded memories"). Furthermore, an individual integrated system must normally comprise both nonvolatile memories and volatile memories. The nonvolatile memories, which are usually of the EEPROM or flash type, are in fact necessary for permanent storage, on the one hand, of portions of program code that are to be executed by the processing and control devices, and on the other, data acquired during operation, such as, for example, digital images. The volatile memories, for example of the DRAM type, are instead used as work memories, on account of their performance in reading and writing, which is considerably higher than the performance of nonvolatile memories.

The integration, in a single device, of logic, of volatile memories, and of nonvolatile memories involves, however, problems that are chiefly due to the fact that the memory cells of the two types have different structures and must therefore be made with different technologies. For each type of cell, it is thus necessary to envisage specific process steps which generally cannot be executed simultaneously, but only in succession. Consequently, the processes of fabrication of a device that incorporates logic and both types of memory are complex and have a high cost.

SUMMARY OF THE INVENTION

An embodiment of the present invention provides an integrated device that is free from the drawbacks described above. Specifically, the embodiment of the present invention provides a device that integrates a nonvolatile memory array and a volatile memory array.

BRIEF DESCRIPTION OF THE DRAWINGS

For a better understanding of the invention, there are now described some embodiments, purely by way of non-limiting example and with reference to the attached drawings, in which.

DESCRIPTION OF PREFERRED EMBODIMENTS

Figure 1:
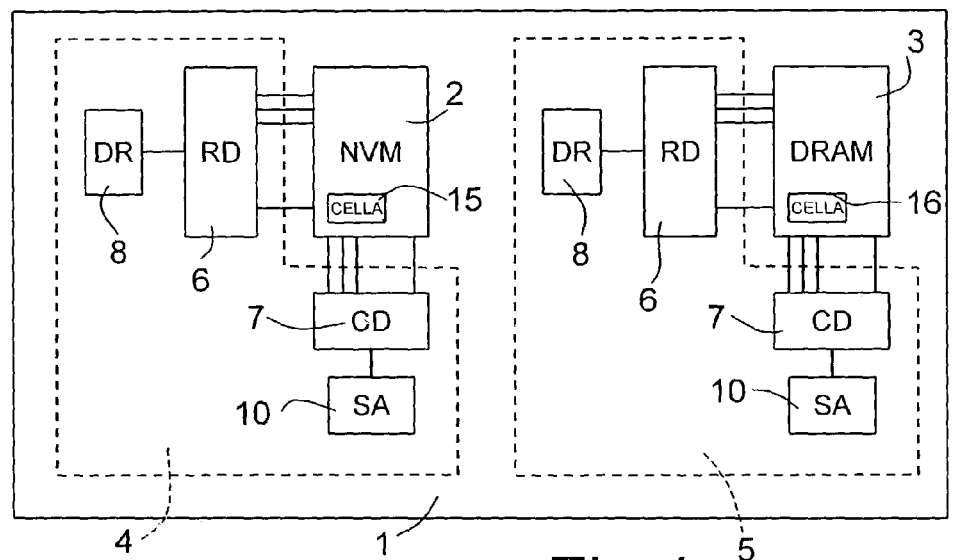
FIG. 1 illustrates a block diagram of a device integrating a nonvolatile memory and a volatile memory according to an embodiment of the invention.

In FIG. 1, a chip 1 of semiconductor material houses both a nonvolatile memory array 2 and a volatile memory array 3, which are associated with a first read/write circuit 4 and, respectively, a second read/write circuit 5, according to an embodiment of the invention. In greater detail, the read/write circuits 4, 5 comprise respective row decoders 6 and column decoders 7, biasing circuits 8 and sense amplifiers 10.

The nonvolatile memory array 2 and the volatile memory array 3 comprise, respectively, a plurality of nonvolatile cells 15 and a plurality of volatile cells (DRAMs) 16. According to a first aspect of the invention, both the nonvolatile cells 15 and the volatile cells 16 are of a ferroelectric type and have the same structure.

Figure 2:
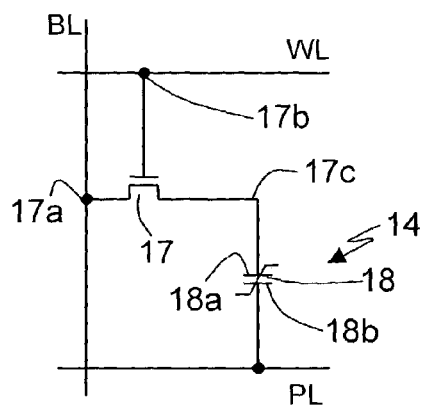
FIG. 2 illustrates a simplified circuit diagram of a cell of one of the memories of FIG. 1 according to an embodiment of the invention.

FIG. 2 illustrates the equivalent circuit of a memory cell 14, representing both a nonvolatile memory cell 15 and a volatile memory cell 16, according to an embodiment of the invention. Each memory cell 14 comprises a transistor 17 and a capacitor 18 having as dielectric a ferro-electric material, for example PZT ($PbZr_{1-x}Ti_xO_3$, perovskite) or SBT ($SrBi_2Ta_2O_9$, stratified perovskite) or BLT ($Bi_{4-x}La_xTi_3O_{12}$, stratified perovskite). The transistor 17, of the NMOS type, has a drain terminal 17a connected to a bitline BL, a gate electrode 17b connected to a wordline WL and a source terminal 17c connected to a first plate 18a of the capacitor 18. A second plate 18b of the capacitor 18 is connected to a plateline PL. In turn, the bitline BL can be connected to the sense amplifier 10 through the column decoder 7 both in the case of the nonvolatile memory array 2 and in the case of the volatile memory array 3.

Figure 3A:
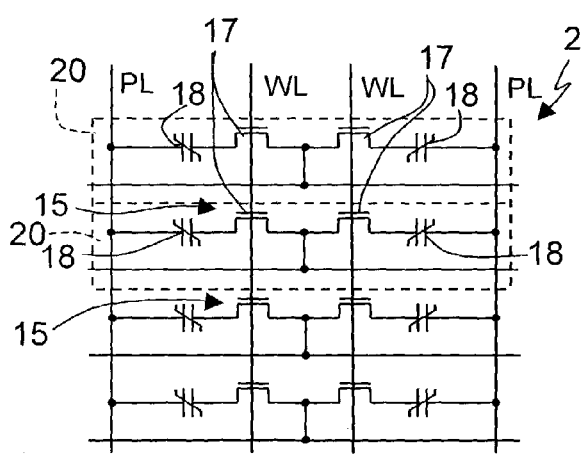
FIGS. 3a and 3b show simplified electrical diagrams of the architecture of the memory arrays of FIG. 1 according to an embodiment of the invention.
Figure 3B:
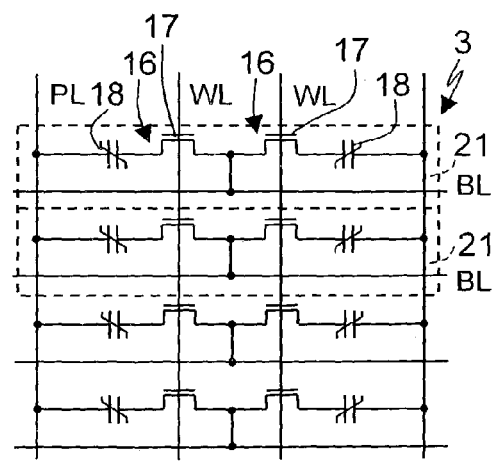

In both of the memory arrays 2, 3, the nonvolatile cells 15 and the volatile cells 16 are preferably organized according to the architecture illustrated in FIGS. 3a and 3b, in accordance with an embodiment of the invention. In particular, the nonvolatile cells 15 are arranged in rows and columns and are combined so that pairs of nonvolatile cells 20 are arranged parallel to the bitlines BL of the nonvolatile memory array 2; likewise, the volatile cells 16 are arranged in rows and columns and are combined so that pairs of volatile cells 21 are arranged parallel to the bitlines BL of the volatile memory array 3. Furthermore, the transistors 17 of each pair of cells 20, 21 have drain regions in common, connected to one and the same bitline BL, whilst the capacitors 18 belonging to pairs of cells 20, 21, which are adjacent in a direction parallel to the bitlines BL, are connected to adjacent pairs of platelines PL.

The memory cells 14 are preferably made as ferro-electric cells of stacked structure, of the type described in U.S. Pat. No. 6,300,654, granted on Oct. 9, 2001, in the name of the present applicant, as regards a nonvolatile cell 15.

Figure 4:
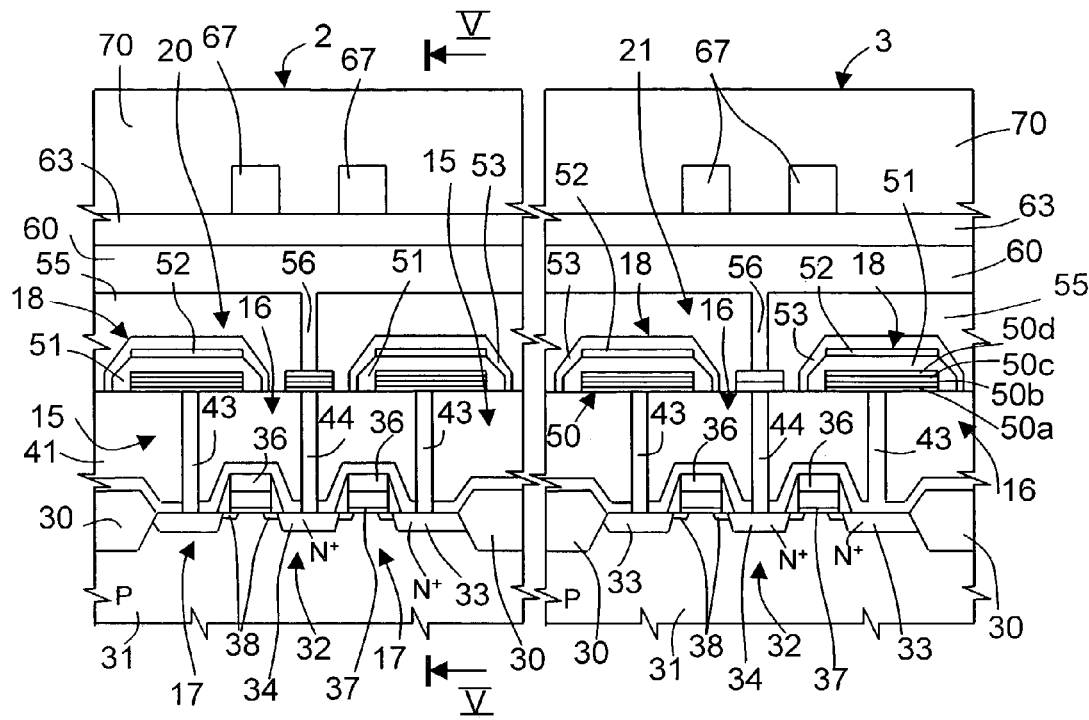
FIG. 4 is a section through a semiconductor chip integrating a device according to a first embodiment of the present invention.

In detail, FIG. 4 is a section through a semiconductor chip showing a pair of nonvolatile cells 20 and a pair of volatile cells 21, according to a first embodiment of the invention. Pairs of nonvolatile cells 20 and pairs of volatile cells 21 are insulated laterally by a thick oxide layer 30 (field oxide), which delimits, inside a substrate 31 of type P, active areas 32, in each of which are formed two source regions 33 and a common drain region 34, of type $N^+$. In a known way, gate electrodes 36 are formed on top of the substrate 31 and are insulated therefrom by a thin oxide layer 37. The gate electrodes 36 are preferably made up of strips comprising a double layer of polycrystalline silicon and tungsten silicide, or titanium silicide, or cobalt silicide, which extend in a direction perpendicular to the plane of FIG. 4 and which define wordlines. The gate electrodes 36 are moreover skirted laterally by spacers made of oxide.

Drain-extension regions 38, which are less heavily doped, are formed in the substrate 31 underneath the spacers, and a protective oxide layer 40 covers the surface of the substrate 31.

A first insulating layer 41 (for example made of Boron Phosphorous Silicon Glass—BPSG) extends on top of the protective oxide layer 40 and has openings in which there extend first contacts 43 and second contacts 44 made of conductive material, for the contact of the source regions 33 and of the drain regions 34, respectively.

Figure 5:
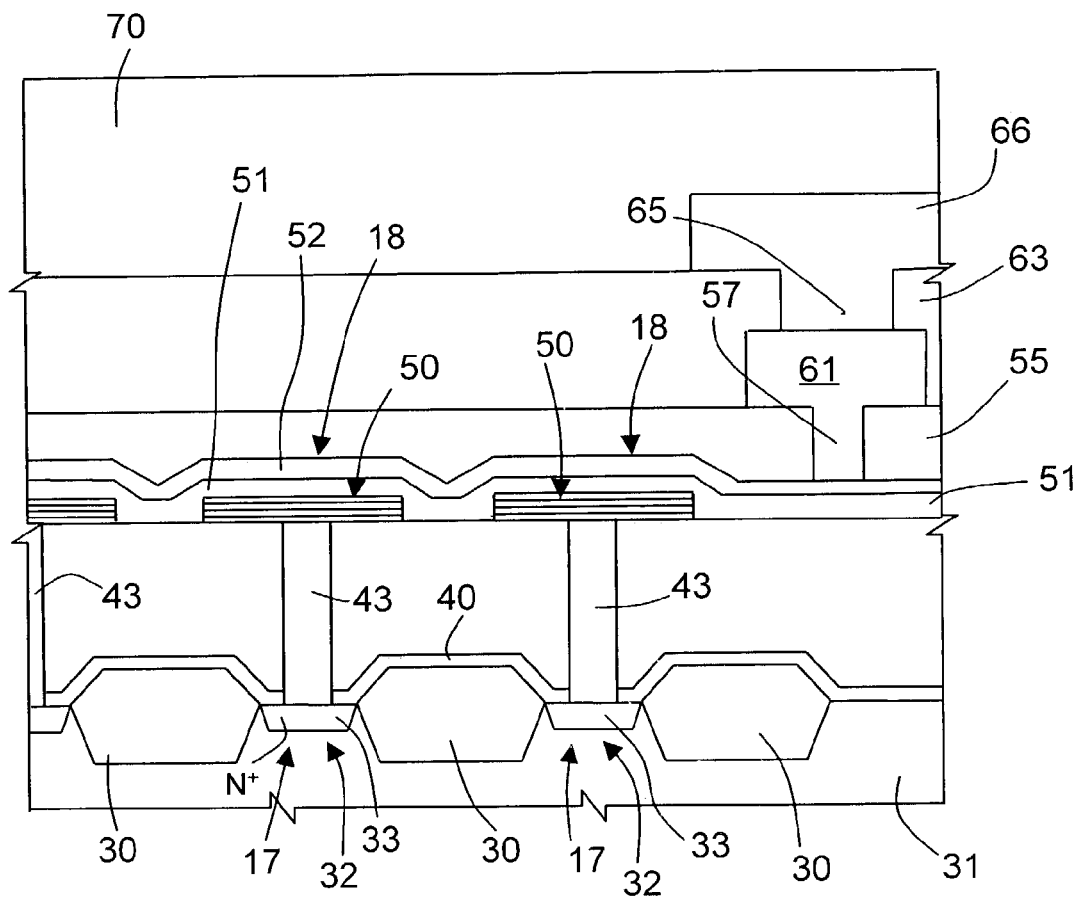
FIG. 5 is a side view, sectioned according to a plane of trace V—V, of the device of FIG. 4 according to the first embodiment of the invention.
Figure 6:
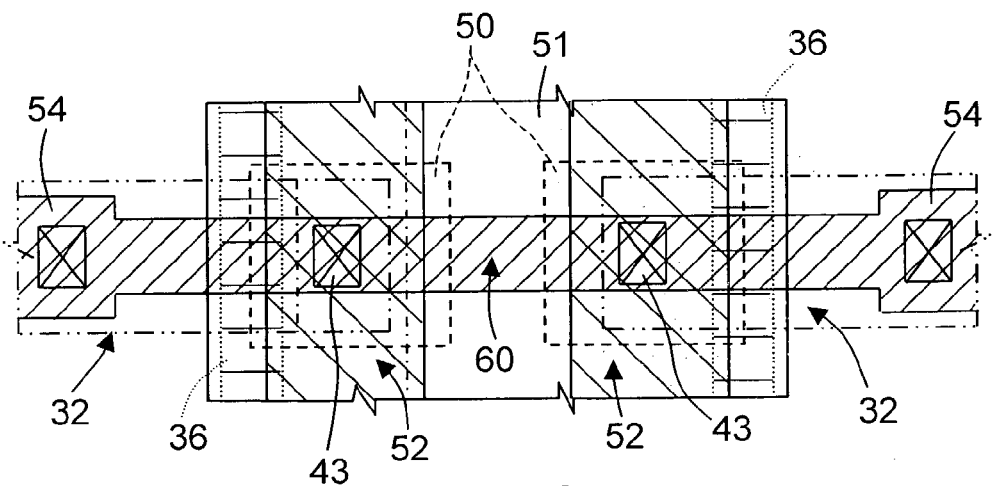
FIG. 6 is a top plan view of a part of the device of FIG. 4 according to the first embodiment of the invention.

On top of the first insulating layer 41 bottom plates 50 are formed (corresponding to the first plates 18a of FIG. 2), which are electrically connected to the first contacts 43. Preferably, each bottom plate 50 is made up of a stack of layers comprising an adhesion layer 50a, preferably TiN, a barrier layer 50b, preferably iridium (Ir), a conductive oxide layer 50c, preferably iridium oxide ($IrO_2$), and a metal layer 50d, preferably platinum (Pt). Strips made of ferro-electric material 51 extend, without any discontinuity, on top of and between adjacent pairs of bottom plates 50, which belong to different pairs of cells 20, 21. Furthermore, the strips made of ferro-electric material 51 extend with continuity on top of, and between, the bottom plates 50 of adjacent cells, as illustrated in the cross-section of FIG. 5 and as emerges clearly also from the layout of FIG. 6. The strips of ferro-electric material 51 of the nonvolatile memory 2 and of the volatile memory 3 have the same thickness.

On top of the strips of ferro-electric material 51 are formed first strips of conductive material 52 forming top plates (corresponding to the second plates 18b of FIG. 2) of the capacitors 18. The first strips of conductive material 52 constitute platelines PL and, as is evident from FIG. 6, have a width smaller than that of the bottom plates 50 (first plates 18a of FIG. 2).

Protective layers 53, for example made of alumina ($Al_2O_3$), coat both the strips of ferro-electric material 51 and the first strips of conductive material 52, so as to prevent, during fabrication, the ferro-electric material from being exposed to environments rich in hydrogen that would degrade them.

On top of the first insulating layer 41, there are moreover first contact regions 54 overlying and connected directly to the second contacts 44. The first contact regions 54 are preferably made with a double layer of titanium and platinum.

A second insulating layer 55 is formed on top of the first insulating layer 41 and coats the first strips of conductive material 52. Through the second insulating layer 55 are formed openings in which there extend third contacts 56 (FIG. 4), connected directly to the first contact regions 54, and openings in which there extend fourth contacts 57 (FIG. 5), connected directly to the first strips of conductive material 52. On top of the second insulating layer 55, metallization lines 60 are formed, which define the bitlines BL and are connected directly to the third contacts 56. Also formed are second contact regions 61 (FIG. 5), which are connected directly to the fourth contacts 57. The metallization lines 60 and the second contact regions 61 are formed in the first metallization level.

On top of the second insulating layer 55, which completely covers the metallization lines 60, a third insulating layer 63 extends, having openings, in which there extend fifth contacts 65 (FIG. 5), connected directly to the second contact regions 61. On top of the third insulating layer 63, there are third contact regions 66, which are connected directly to the fifth contacts 65 and are made in the second metallization level, as well as second strips of conductive material 67, which are connected, in a way not shown, to the wordlines that form the gate electrodes 36.

A passivation layer 70 covers the device completely.

The process for the fabrication of the nonvolatile cells 15 and of the volatile cells 16, illustrated in the FIGS. 4–7, is described hereinafter. After the transistors 17 have been made, after the covering with the first insulating layer 41 has been performed, and after the first contacts 43 and second contacts 44 have been formed, the adhesion layer 50a, the barrier layer 50b, the conductive oxide layer 50c, and the metal layer 50d are deposited sequentially and are defined simultaneously, in a known way. A layer of ferro-electric material is deposited and then a layer of platinum is deposited (for example by sputtering). Next, using a second mask, the first strips of conductive material 52 are defined (via etching of the platinum layer), and, using a third mask, the strips made of ferro-electric material 51 are defined. Then the protective layers 53 are deposited and defined so as to coat both the strips of ferro-electric material 51 and the first strips of conductive material 52.

In this way, the nonvolatile cells 15 and the volatile cells 16 are fabricated simultaneously and have the same structure. Nevertheless, the former can be used for permanent storage of binary information and the latter for temporary storage, as explained in what follows.

In particular, a nonvolatile cell 15 is able to store binary information in a permanent way thanks to the characteristics of hysteresis of the ferro-electric material which is comprised between the plates 18a, 18b and which can assume, in the absence of an applied voltage, two polarization states depending upon the sign of the voltage applied previously across the capacitor 18. In greater detail, a ferro-electric material comprises a plurality of domains, each of which can assume, selectively, one of two possible polarization states. The polarization state of the domains can moreover be modified by applying an electric field having an intensity higher than a switching threshold. At a macroscopic level, the overall polarization state of the ferro-electric material is determined by the number of domains biased uniformly.

Figure 7:
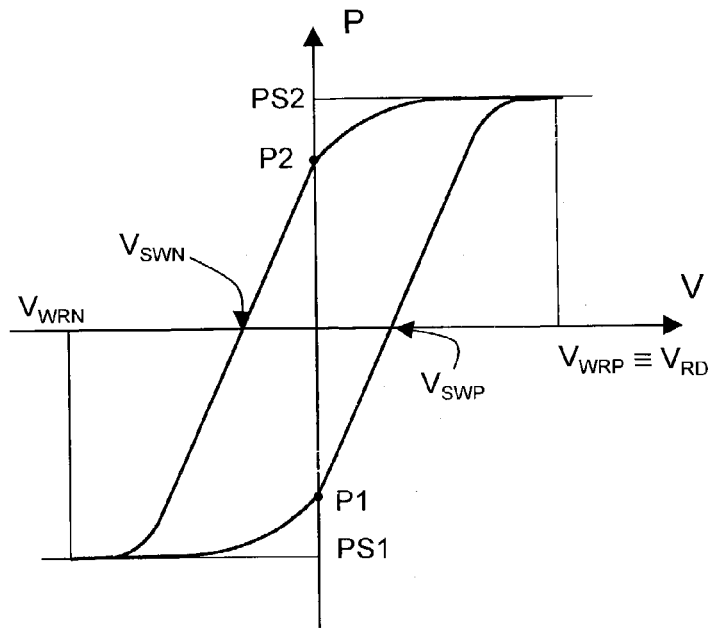
FIG. 7 is a graph showing plots of quantities present in the device according to the first embodiment of the invention.

In particular, FIG. 7 illustrates a characteristic of the polarization state of the ferro-electric material present in the capacitor 18 of a nonvolatile cell 15 as a function of the voltage V applied between the plates 18a, 18b, according to an embodiment of the invention. For reasons of convenience, the said polarization state will be designated hereinafter as polarization P of the nonvolatile cell 15. As may be noted, when the voltage V is zero, the polarization P of the nonvolatile cell 15 can assume alternatively a first stable state P1, to which is associated a first logic value (for example the logic value "1"), or a second stable state P2, to which is associated a second logic value (for example the logic value "0").

For storing a "0", a positive write voltage $V_{WRP}$ higher than a positive switching voltage $V_{SWP}$ is applied across the capacitor 18. In this case, the polarization P of the nonvolatile cell 15 assumes a second saturation state PS2 irrespective of the initial polarization state, insofar as all the domains of the ferro-electric material are uniformly oriented. Then, when the voltage V is removed, the polarization P of the nonvolatile cell 15 goes to the second stable state P2. In a dual manner, to store a "1", a negative write voltage $V_{WRN}$ is applied across the capacitor 18, which is higher in absolute value than a negative switching voltage $V_{SWN}$. The polarization P of the nonvolatile cell 15 reaches a first saturation value PS1, irrespective of the initial state, and goes to the first stable state P1 when the voltage V is removed. The positive switching voltage $V_{SWP}$ and the negative switching voltage $V_{SWN}$ increase in absolute value as the thickness of the strips made of ferro-electric material 51 increases.

In the case of the volatile memory array 3, the capacitors 18 of the volatile cells 16 are used for storing information in a way similar to what occurs normally for memories of the DRAM type. In particular, all the volatile cells 16 are previously brought to one and the same stable state, preferably to the second stable state P2. For this purpose, the volatile cells 16 are supplied with biasing voltages of the same sign higher in absolute value than the switching voltage of the volatile cells 16 themselves. Next, when a read/write operation of a volatile cell 16a is carried out, the latter is supplied with a positive voltage lower in value than the positive switching voltage $V_{SWP}$, hence so as not to modify significantly the polarization state of the volatile cells 16 themselves. For example, a linear-ramp read/write positive voltage is used. In practice, in this case a segment of the branch of the characteristic of FIG. 7 is advantageously exploited, which extends from the second stable point P2 in the right-hand half-plane (V>0), which can be substantially considered linear. The volatile cells 16 thus constitute, in effect, the DRAM cells.

It is evident that the device described is very simple to build. In this case, in fact, the nonvolatile memory array 2 and the volatile memory array 3 are made up of identical memory cells 14, obtained simultaneously using the very same fabrication steps. The device according to an embodiment of the invention can hence be obtained by means of a considerably simplified process, which is less expensive and affords a higher yield.

Figure 8:
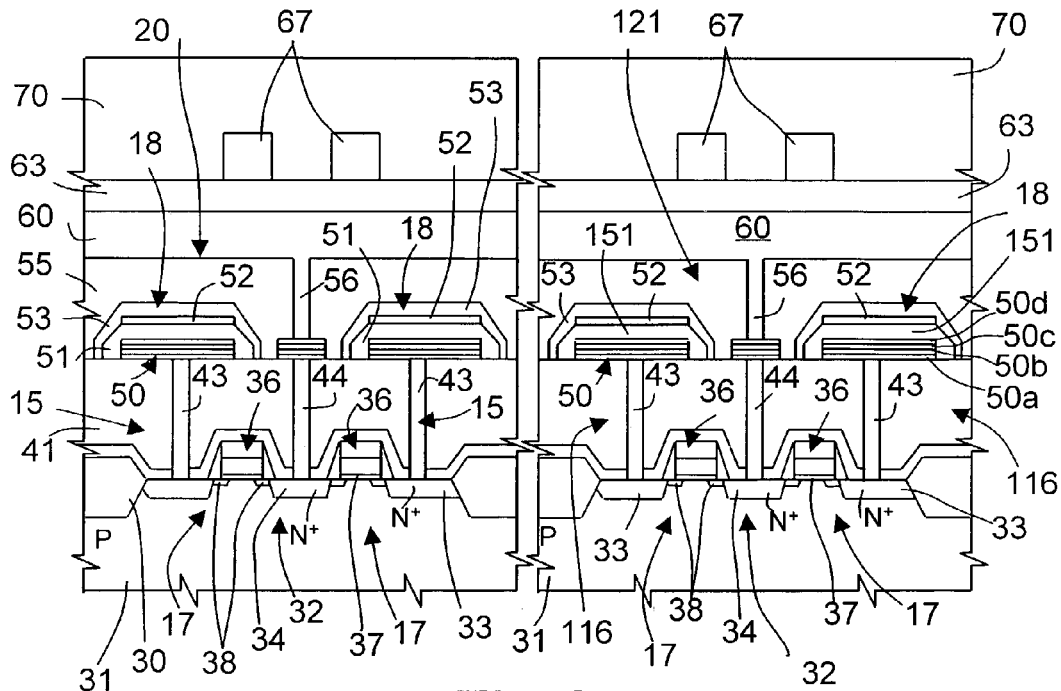
FIG. 8 is a cross section through a semiconductor chip integrating a device according to a second embodiment of the present invention.

A second embodiment of the invention is illustrated in FIG. 8, in which parts that are the same as the ones already illustrated are designated by the same reference numbers. In particular, FIG. 8 shows a pair of nonvolatile cells 20, formed by nonvolatile cells 15 like those shown in FIG. 4, and a pair of volatile cells 121, formed by volatile cells 116, made in the same substrate 31. The volatile cells 121 have the same structure as the volatile cells 21 of FIG. 4; however, between the bottom plates 50 and the strips of conductive material 52 there are strips of ferro-electric material 151 having a thickness greater than the strips of ferro-electric material 51 of the nonvolatile cells 15. For example, the thickness of the strips of ferro-electric material 151 is twice that of the strips 51. Consequently, the positive switching voltage $V'_{SWP}$ and the negative switching voltage $V'_{SWN}$ for the volatile cells 116 are higher (in the case in point twice as high).

Figure 9:
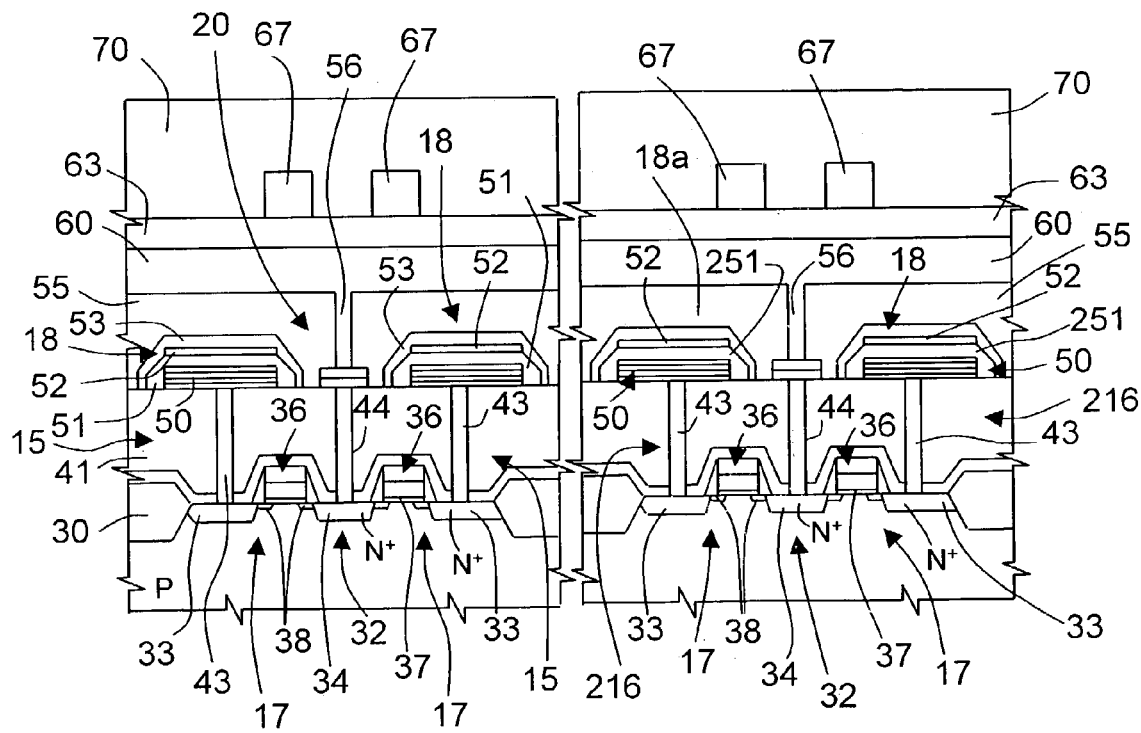
FIG. 9 is a cross section through a semiconductor chip integrating a device according to a third embodiment of the present invention.

In a third embodiment of the invention illustrated in FIG. 9, volatile cells 216 comprise strips made of para-electric material 251, for example BST ($BaSr_{1-x}Ti_xO_3$), set between the bottom plates 50 and the strips of conductive material 52. In this way, capacitors of an almost traditional type are obtained, even though the volatile cells 216 as a whole have a structure that is the same as that of the nonvolatile cells 15.

The volatile cells 216 are made substantially following the same process steps adopted for fabricating the nonvolatile cells 15, except in that the layer of ferro-electric material 51 is removed from the area where the volatile cells 216 are to be made. In addition, special steps of deposition, photolithography and etching are envisaged for defining the strips of para-electric material 251, which is removed completely from the area of the nonvolatile cells 15.

Figure 10:
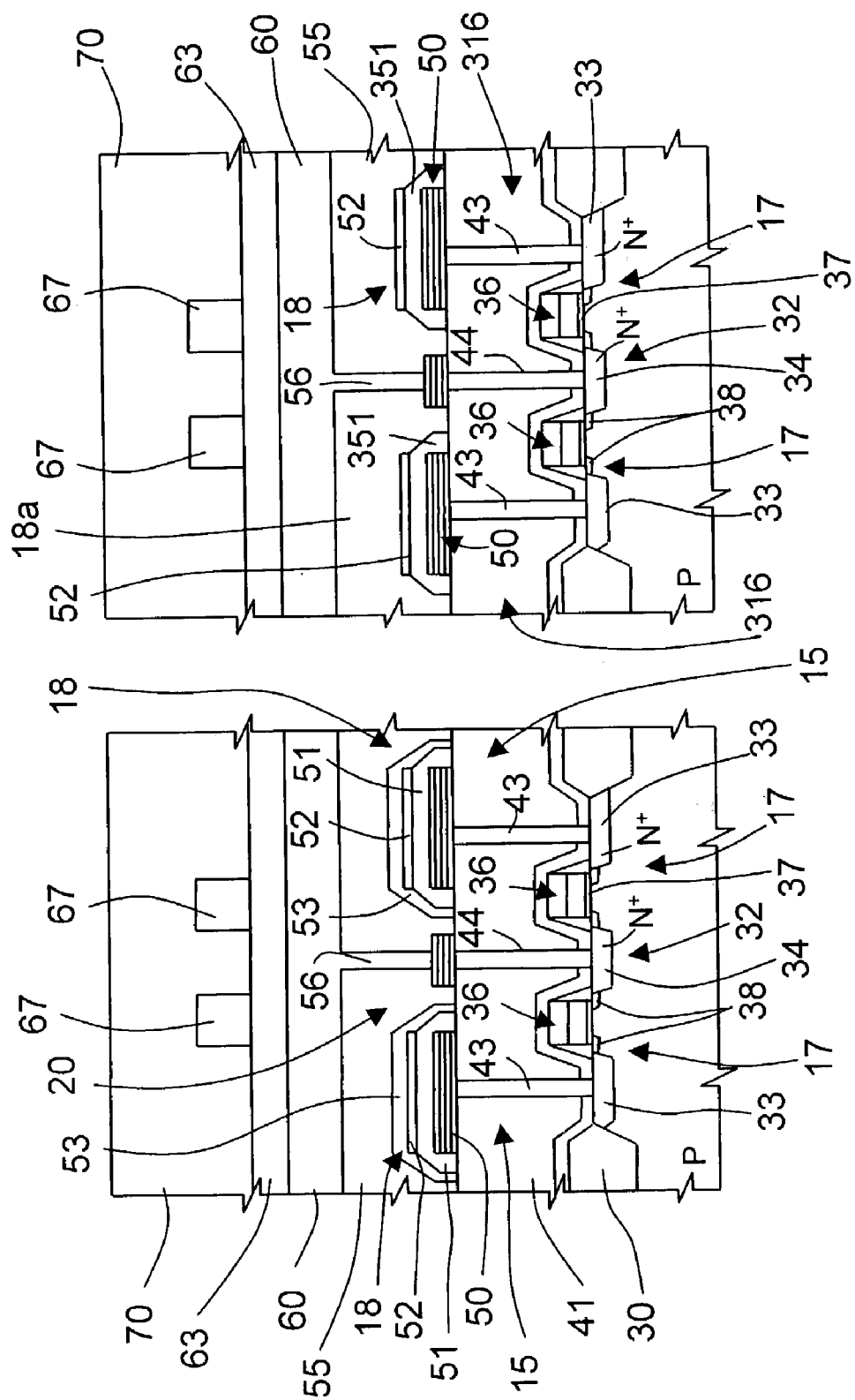
FIG. 10 is a cross section through a semiconductor chip integrating a device according to a fourth embodiment of the present invention.

According to a further embodiment of the invention illustrated in FIG. 10, volatile cells 316 are obtained by degradation of the ferro-electric material forming the strips 51. In detail, during fabrication, the ferro-electric material is deposited and defined by means of the same process steps adopted for making the strips of ferro-electric material 51 of FIGS. 4 and 5. Then, whereas the strips of ferro-electric material 51 of the nonvolatile cells 15 are coated with the protective layers 53, the strips of ferro-electric material 351 of the volatile cells 316 are left uncoated. Consequently, when, during fabrication, the ferro-electric material is exposed to hydrogen-rich environments, the ferro-electric material is degraded and loses its capacity to preserve two different polarization states. In practice, the strips made of ferro-electric material 351 are transformed into strips of para-electric material, with high relative dielectric constant and a characteristic free from hysteresis.

Finally, it is evident that modifications and variations can be made to the device described, without thereby departing from the scope of the present invention.

What is claimed is:

1. An integrated circuit, comprising:
   a first rewritable memory cell having a first storage capacitor and configured to operate only as a nonvolatile memory cell; and
   a second memory cell having a second storage capacitor and configured to operate as a volatile memory cell wherein:
   the first storage capacitor comprises a first ferro-electric layer; and
   the second storage capacitor comprises a second ferro-electric layer that is thicker than the first ferro-electric layer.

2. The integrated circuit of claim 1 wherein the first and second storage capacitors each comprise a respective ferro-electric capacitor.

3. The integrated circuit of claim 1 wherein:
the first storage capacitor comprises a first dielectric; and
the second storage capacitor comprises a second dielectric that is thicker than the first dielectric.

4. The integrated circuit of claim 1 wherein the nonvolatile memory cell has a structure that is the same as the structure of the volatile memory cell.

5. A method, comprising:
in a mode of operation, storing data in a first memory cell on an integrated circuit in a nonvolatile manner by applying a first voltage to the cell, the absolute value of the first voltage exceeding an absolute value of a switching voltage of the first cell, the first memory cell having one and only one capacitor;
in the same mode of operation, storing different data in the first memory cell in a nonvolatile manner; and
in the same mode of operation, storing data in a second memory cell on the integrated circuit in a volatile manner by applying a second voltage to the cell, the absolute value of the second voltage being less than an absolute value of the switching voltage of the second cell.

6. The method of claim 5 wherein the first and second memory cells each comprise a respective ferro-electric capacitor.

7. The integrated circuit of claim 4 wherein the second memory cell is configured to operate only as a volatile memory cell.

8. A method for reading/writing a memory having a plurality of cells including a capacitor, which is formed by a first electrode, a second electrode, and by a ferro-electric material set between said first electrode and said second electrode, the method comprising the steps of:
during an operational mode of the memory, reading/writing a first one of said cells in a volatile manner by, bringing said first cell into a first stable state, and
supplying to said first cell a read/write voltage in absolute value lower than switching voltages of said cell, said first cell having one and only one capacitor; and
during the same operational mode of the memory, reading/writing a second one of said cells in a nonvolatile manner by,
bringing said second cell into a first stable state, and
supplying to said second cell a read/write voltage in absolute value higher than switching voltages of said second cell, said second cell having one and only one capacitor.

9. A method, comprising:
during a mode of operation, storing data in a first memory cell in a nonvolatile manner, the first memory cell disposed on an integrated circuit and including a nonvolatile storage capacitor having a portion that is disposed in a layer of the integrated circuit;
during the same mode of operation, storing different data in the first memory cell in a nonvolatile manner; and
during the same mode of operation, storing data in a second memory cell in a volatile manner, the second memory cell disposed on the integrated circuit and including a volatile storage capacitor having a portion that is disposed in the layer of the integrated circuit.

10. A method, comprising:
in a mode of operation, storing data in a first memory cell on an integrated circuit in a nonvolatile manner by applying a first voltage to the cell, the absolute value of the first voltage exceeding an absolute value of a switching voltage of the first cell;
in the same mode of operation, storing different data in the first memory cell in a nonvolatile manner; and
in the same mode of operation, storing data in a second memory cell on the integrated circuit in a volatile manner by applying a second voltage to the cell, the absolute value of the second voltage being less than an absolute value of the switching voltage of the second cell, the second memory cell having one and only one capacitor.

* * * * *